United States Patent
Cheek et al.

(10) Patent No.: US 6,261,885 B1
(45) Date of Patent: Jul. 17, 2001

(54) METHOD FOR FORMING INTEGRATED CIRCUIT GATE CONDUCTORS FROM DUAL LAYERS OF POLYSILICON

(75) Inventors: Jon D. Cheek, Round Rock; Daniel Kadosh, Austin; Mark W. Michael, Cedar Park, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/497,789

(22) Filed: Feb. 3, 2000

Related U.S. Application Data

(62) Division of application No. 09/237,773, filed on Jan. 26, 1999, now Pat. No. 6,137,145.

(51) Int. Cl.$^7$ .................................... H01L 21/8238
(52) U.S. Cl. .................... 438/199; 438/283; 438/305
(58) Field of Search ...................... 438/199, 229, 438/231, 232, 283, 305, 585, 587, 588, 592, 919; 257/385, 369, 412

(56) References Cited

U.S. PATENT DOCUMENTS

| | | | |
|---|---|---|---|
| 4,438,556 | 3/1984 | Komatsu et al. | 438/532 |
| 5,021,356 | 6/1991 | Henderson et al. | 438/294 |
| 5,158,903 | 10/1992 | Hori et al. | 438/302 |
| 5,346,836 | 9/1994 | Manning et al. | 438/307 |
| 5,355,010 | 10/1994 | Fujii et al. | 257/377 |
| 5,480,830 * | 1/1996 | Liao et al. | 438/199 |
| 5,501,995 | 3/1996 | Shin et al. | 438/301 |
| 5,521,416 | 5/1996 | Matsuoka et al. | 257/377 |
| 5,543,646 | 8/1996 | Satoh et al. | 257/344 |
| 5,574,294 | 11/1996 | Shepard | 257/66 |
| 5,585,659 | 12/1996 | Kobayashi et al. | 257/371 |
| 5,616,948 | 4/1997 | Pfiester | 257/412 |
| 5,710,454 | 1/1998 | Wu | 257/413 |
| 5,744,845 | 4/1998 | Sayama et al. | 257/371 |
| 5,780,330 * | 7/1998 | Choi | 438/232 |
| 5,851,889 | 12/1998 | Michael et al. | 438/301 |
| 5,877,535 | 3/1999 | Matsumoto | 257/369 |
| 5,930,612 * | 7/1999 | Ito | 438/199 |
| 6,027,961 * | 2/2000 | Maiti | 438/199 |
| 6,087,246 * | 7/2000 | Lee | 438/517 |

FOREIGN PATENT DOCUMENTS

| | | |
|---|---|---|
| 0 075 945 | 4/1983 | (EP). |
| 3-227516 | 10/1991 | (JP). |
| 4-2168 | 1/1992 | (JP). |
| 4-154170 | 5/1992 | (JP). |
| 6-151834 | 5/1994 | (JP). |
| 6-169082 | 6/1994 | (JP). |

* cited by examiner

*Primary Examiner*—Olik Chaudhuri
*Assistant Examiner*—Hoai Pham
(74) *Attorney, Agent, or Firm*—Kevin L. Daffer; Conley, Rose & Tayon P.C.

(57) ABSTRACT

A method for fabricating an integrated circuit is presented wherein a first polysilicon layer dielectrically spaced above a semiconductor substrate is provided. The semiconductor substrate contains a first active region and a second active region. A first dopant is selectively introduced into the portion of the first polysilicon layer above the second active region. A second polysilicon layer may then be formed upon the first polysilicon layer and above the first active region and the second active region. A second dopant may be selectively introduced into a portion of the second polysilicon layer above the first active region. The portion of the second polysilicon layer above the first active region and the portion of the first polysilicon layer above the first active region may be patterned to form a first gate structure within the first active region. The portion of the second polysilicon layer above the second active region and the portion of the first polysilicon layer above the second active region may be patterned to form a second gate structure within the second active region.

15 Claims, 3 Drawing Sheets

METHOD FOR FORMING INTEGRATED CIRCUIT GATE CONDUCTORS FROM DUAL LAYERS OF POLYSILICON

This is a Division of application Ser. No. 09/237,773, filed Jan. 26, 1999, U.S. Pat. No. 6,137,145.

BACKGROUND OF THE INVENTION

1. Field of the Invention

This invention relates to semiconductor processing and, more particularly, to a method for forming CMOS integrated circuit gate conductors having reduced susceptibility to polysilicon depletion and boron penetration.

2. Description of the Related Art

Fabrication of a metal oxide semiconductor field-effect transistor ("MOSFET") device is well known. MOSFETs are generally manufactured by placing an undoped polycrystalline silicon ("polysilicon") layer over a relatively thin silicon dioxide ("oxide") layer. The polysilicon layer and the oxide layer are then patterned to form a gate conductor arranged upon a gate oxide with source/drain regions adjacent to and on opposite sides of the gate conductor. The gate conductor may be used to self-align impurities forwarded into the substrate on opposite sides of the gate conductor. The gate conductor and source/drain regions are then concurrently implanted with a dopant species. If the dopant species used is n-type, then the resulting MOSFET is an NMOS ("n-channel") transistor device. Conversely, if the dopant species is p-type, then the resulting MOSFET is a PMOS ("p-channel") transistor device. Integrated circuits typically use either n-channel devices exclusively, p-channel devices exclusively, or a combination of both on a single substrate. The combination of an n-channel device and a p-channel device on a single substrate is termed a complementary MOS ("CMOS") device.

CMOS circuits offer numerous performance, reliability, design, and cost advantages over NMOS or PMOS circuits, and have become the dominant integrated circuit technology. One basic process for forming transistors for CMOS circuits (hereinafter "the basic CMOS process") only requires slight modification of the general technique for forming MOSFETs described above. In the basic CMOS process, a thin oxide layer is first formed upon a silicon substrate. The silicon substrate contains two active regions laterally separated by a field region. The field region includes an isolation structure, which may be formed by trench isolation or local oxidation of silicon ("LOCOS") techniques. A single layer of undoped polysilicon is then deposited on the oxide layer. Gate structures are then formed within the active regions by patterning the layer of polysilicon and the layer of oxide. The resulting structures each include a gate conductor formed from the polysilicon layer and a gate oxide formed from the oxide layer. One of the active regions, typically the region in which the p-channel device is to be formed, is covered with a masking layer of photoresist. N-type dopants are concurrently implanted into the other gate conductor and the adjacent semiconductor substrate. Such implantation serves both to dope the gate conductor and to form lightly-doped regions ("LDD") in the silicon substrate. Oxide spacers are then formed on the sidewall of the uncovered gate structure. A second implant dose is then forwarded into the gate structure and the silicon substrate adjacent to the exposed lateral surfaces of the spacers. The second implant is done at a higher implant energy and dose than the first and creates source/drain regions within the silicon substrate. The process is then repeated for the p-channel transistor, except now p-type dopants are implanted.

As implied above, ion implantation is commonly used both for forming junctions and for doping the gate conductor. An advantage of ion implantation over older techniques such as solid-state diffusion is that ion implantation allows greater control over the dopant profile. By modifying the implant dose and energy appropriately, the depth of the implanted area and the dopant distribution within that area may be precisely controlled. Because of this property, ion implantation is usually used to form the shallow junctions necessitated by the sub-micron channel lengths common in MOS transistors. Shallow junctions help reduce susceptibility to short-channel effects, make the device less prone to punchthrough effects, and reduce parasitic capacitance. By reducing the vertical depth of the junctions, the lateral spread of dopants beneath the gate structure from these regions is also curtailed. Hence, the degree of reduction in effective channel length resulting from dopant migration is lessened. To achieve shallow junctions, relatively low implant energies are used to ensure that the dopants are implanted close to the upper surface of the semiconductor substrate.

In forming MOS devices with polysilicon gate conductors, the polysilicon from which the gate conductor is formed must be doped to lower its sheet resistivity. Dopants should also be implanted sufficiently deep within the gate conductor that a large quantity of the dopants diffuse to the bottom of the gate conductor during subsequent heat processing. Accordingly, dopants, particularly heavier n-type atoms such as arsenic, must be given a relatively high implant energy to ensure that these atoms are implanted sufficiently deep within the gate conductor. On the other hand, dopants that diffuse relatively quickly through polysilicon, such as boron, do not need to be implanted as deeply. Regardless of the diffusion rate through polysilicon of the implanted dopant, the ideal implant energy for doping the gate conductor is often higher than the ideal implant energy for forming shallow junctions. Furthermore, the different diffusion rates through polysilicon for n-type dopants (e.g., arsenic and phosphorus) and p-type dopants (e.g., boron and boron difluoride) may be problematic when attempting to form p-channel and n-channel gate conductors from a single polysilicon layer. Two conditions that can result in such a situation are polysilicon depletion and boron penetration.

Arsenic is typically used to dope the polysilicon gate and to form junctions within the silicon substrate for n-channel devices. As stated above, arsenic is a relatively slow diffuser and will not readily migrate through polysilicon even during substantial heat treatment. If arsenic is not implanted deep into the gate conductor, the arsenic diffusion that will result from subsequent heat processing may not be enough to cause a sufficient quantity of arsenic to migrate near the polysilicon/oxide interface. Thus, a lower portion of the polysilicon remains substantially undoped or "depleted". The undoped lower portion of the gate conductor acts as a high permittivity region that deleteriously hinders performance of the transistor by increasing the effective thickness of the gate oxide. This increase in effective oxide thickness can cause the "turn-off" characteristics of the transistor to increase beyond acceptable values.

Boron, in the form of boron or boron difluoride ions, is typically used to dope the polysilicon gate and to form the junctions within the silicon substrate for p-channel devices. The diffusion rate of boron in polysilicon is relatively high, so boron implanted into a gate conductor will migrate significantly during heat processing. Boron penetration can occur when boron atoms are implanted too deeply into the gate conductor. In such circumstances, the diffusion of these atoms can result in the atoms penetrating the gate oxide. This penetration may reduce the reliability of the gate oxide. Furthermore, boron may even continue through the gate oxide into the underlying channel. The presence of boron in the channel can change the doping concentration in the channel, resulting in threshold voltage shift. Boron penetration into the channel can also cause other undesirable effects such as an increase in electron trapping, a decrease in low-field hole mobility, and degradation of the drive current. Because boron migrating from the lower portions of the gate conductor as a result of uncontrolled channel doping may leave the lower portion of the gate conductor with a less than optimal dopant concentration, boron penetration can also cause polysilicon depletion.

Since the basic CMOS process forms both the n-channel and p-channel gate conductor from the same layer of polysilicon, both gate conductors will have the same thickness. While it may be beneficial to increase the thickness of the gate conductors by increasing the thickness of the polysilicon layer from which they are formed so that boron penetration is minimized, such an increase would make getting the necessary amount of arsenic to the polysilicon-oxide interface in the n-channel conductor even more difficult. Likewise, decreasing the thickness of the polysilicon layer from which the gate conductors are formed would help ensure that arsenic was implanted sufficiently deep in the n-channel conductor, but the reduction in the height of the p-channel gate conductor may increase the probability of boron penetration in that device.

One prior process that attempts to resolve this dilemma starts by depositing a single layer of polysilicon upon an oxide layer. The oxide layer overlies a pair of active areas within a silicon substrate. A mask is formed over the portions of the polysilicon layer above the active area in which the n-channel device will be fabricated, and the uncovered portions of the polysilicon layer are implanted with a p-type dopant such as boron. The previously implanted portions of the polysilicon layer are now covered with a mask while the undoped portion of polysilicon layer overlying the n-channel active area is etched back to a second thickness that is substantially less than the initial thickness of the polysilicon layer. An n-type dopant such as arsenic is then implanted into the unmasked portions of the polysilicon layer. The polysilicon layer is then patterned to produce a relatively thick p-doped gate conductor in one active area and a thinner n-doped gate conductor in the other active area. In this manner, the p-doped gate conductor may be made thick enough to prevent boron penetration and the n-doped gate conductor may be thin enough to ensure that an adequate amount of n-type dopant is placed at the gate conductor lower elevations.

Unfortunately, the above-described process has numerous disadvantages. One of these disadvantages arises from the fact that it is difficult to achieve highly accurate thickness control when etching back a layer of polysilicon. If the precise thickness of the n-channel gate conductor is not known, correctly modeling device properties may be difficult. In addition, a layer of photoresist will be spun on and developed to define the pattern for subsequent etching of the p-channel gate conductor and n-channel gate conductor. The difference between the thickness of the polysilicon layer at the portion from which the p-channel conductor will be formed and the thickness of the polysilicon at the portion from which the n-channel gate conductor will be formed can unfortunately lead to, for example, depth of field problems when exposing the photoresist. This and other focus problems may lead to an inaccurate pattern being transferred to the resist, and ultimately to the polysilicon layer. Furthermore, it is preferred that etching of the polysilicon layer to form each gate conductor occurs concurrently. The polysilicon layer is thicker, however, in the portions from which the p-channel device will be formed than in the portions from which the n-channel device will be formed. Consequently, a simultaneous etch of both of these portions will reach the portions of the oxide layer beneath the portions of the polysilicon layer earlier on the n-doped side of the polysilicon layer than on the p-doped side. The gate conductor etch process must, unfortunately, be made more complex to resolve this situation.

Therefore, it would be desirable to develop a technique for fabricating adjacent n-channel and p-channel transistors that have gate conductors of similar heights but are still substantially resistant to polysilicon depletion and boron migration. It would be further beneficial to achieve such goals without needing to rely on etchback techniques to control the thickness of the gate conductors. The process should allow dopant implantation of the gate conductors to be carried out independently of dopant implantation for junction formation.

SUMMARY OF THE INVENTION

The problems described above are in large part addressed by the improved integrated circuit fabrication method and product presented herein. The method provides for the formation of adjacent n-channel and p-channel transistors having gate conductors etched from dual layers of polysilicon. Dopants are forwarded into select portions of each polysilicon layer after the layer is formed. Because of the ability to scale the total thickness of polysilicon into which each set of dopants is introduced, the probability of boron penetration and polysilicon depletion is substantially reduced. Furthermore, the present process affords a substantially planar surface for the patterning of the gate conductors. As such, depth of field problems, as well as any other patterning difficulties caused by lack of planarization, are minimized. In the present method, the implants into the polysilicon to render the to-be-formed gate conductors conductive are preferably done such that junctions are not concurrently formed. Consequently, the ion energy in any junction formation step may be determined without regard to the need for doping the gate conductors.

Broadly speaking, a method for fabricating an integrated circuit is presented wherein a first polysilicon layer is dielectrically spaced above a semiconductor substrate. The semiconductor substrate contains a first active region and a second active region. A first dopant is selectively introduced into the portion of the first polysilicon layer above the second active region. A second polysilicon layer may then be formed upon the first polysilicon layer and above the first active region and the second active region. A second dopant may be selectively introduced into a portion of the second polysilicon layer above the first active region.

The diffusion length of dopants implanted into the gate conductor must be taken into account when attempting to prevent polysilicon depletion and boron penetration. There are four main variables that determine how far implanted dopants will diffuse after implantation into polysilicon: the implant species, the implant dose, the implant energy, and the thermal budget. The particular properties of an implant species, of course, determine the diffusion constant of that species. The implant dose has a large effect on the concentration distribution of the implant species. The implant energy has a strong impact on the depth at which the species is implanted. Finally, the total thermal budget of all subsequent heat processing steps must be accounted for if the final position of the implanted dopants is to be known. Thermal budget is often used to relate the total amount of heat transferred to a wafer by a particular process. In general, the higher the thermal budget of a heat treatment process is, the greater the diffusion length of a particular dopant brought about that process.

The present process beneficially allows for the thickness of the polysilicon layer to be scaled to take into account variations in the diffusion length of the implanted dopants caused by changes in the aforementioned variables. Such scaling may be accomplished, in part, by deposition of polysilicon layers at appropriate thicknesses. Deposition of the polysilicon layers affords greater control over the thickness of such layers than, for example, some prior methods that attempt to achieve similar goals by use of etchback techniques. The first dopant is preferably a slower diffusing n-type dopant (such as arsenic or phosphorus), and the second dopant is preferably a faster diffusing p-type dopant (such as boron or boron difluoride). In the present process, the slower diffusing dopant is preferably implanted into first polysilicon layer while the faster diffusing dopant is preferably implanted into the second polysilicon layer. Consequently, the first polysilicon layer may be deposited such that the peak concentration of the first dopant, subsequent to and during further processing steps, diffuses sufficiently close to the underlying gate oxide to avoid dopant depletion without a substantial quantity of the first dopant diffusing through the gate oxide.

The second polysilicon layer is preferably deposited upon the first polysilicon layer after implantation of the first dopant. Thus, the second polysilicon layer may be deposited such that the total thickness of the first and second polysilicon layers allows the peak concentration of the second dopant, subsequent to and during further processing steps, to diffuse sufficiently close to the underlying gate oxide that dopant depletion is avoided without a substantial quantity of the second dopant diffusing through the gate oxide. The process therefore allows the thickness of the first polysilicon layer to be largely determined by the diffusion variables applicable to the first dopant and the thickness of the second polysilicon layer to be determined largely by the diffusion variables applicable to the second dopant.

A semiconductor substrate is also presented. A first gate conductor is arranged upon a first gate dielectric and above the semiconductor substrate, and a second gate conductor is arranged upon a second gate dielectric and above the semiconductor substrate. The semiconductor substrate may contain a first active region laterally separated from a second active region by a field region. The first gate conductor may be arranged within the first active region, and the second gate conductor may be arranged within the second active region. Each gate conductor preferably includes a second polysilicon layer portion arranged upon a first polysilicon layer portion. The thicknesses of the first gate conductor and the second gate conductor are preferably equal. The first gate conductor may be doped with a first dopant that has a lower diffusion rate through polysilicon than a second dopant with which the second gate conductor is doped. The second polysilicon layer portion of the second gate conductor is substantially free of implanted dopants. However, dopant ions may later be implanted into the portions of the semiconductor substrate within the first and second active region adjacent to the first and second gate conductors to form junctions. Implantation of the semiconductor substrate to form such junctions preferably results in dopant implantation of the second polysilicon layer portion of the second gate electrode such that the portion is no longer substantially free of implanted dopants. The polysilicon gate electrodes may later be reacted with cobalt or titanium to form a very low resistance polycide.

BRIEF DESCRIPTION OF THE DRAWINGS

Other objects and advantages of the invention will become apparent upon reading the following detailed description and upon reference to the accompanying drawings in which.

Figure 1:
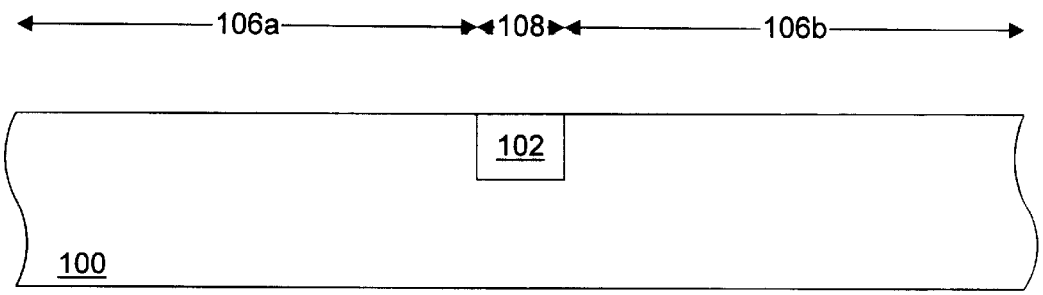
FIG. 1 is a partial cross-sectional view of a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Referring now to the drawings, FIG. 1 shows a partial cross-sectional view of semiconductor substrate 100. Semiconductor substrate 100 preferably comprises an epitaxial layer of lightly doped n-type or p-type single crystal silicon. This lightly-doped epitaxial layer is formed upon a more heavily-doped wafer of single crystal silicon. Isolation structure 102 may be formed in semiconductor substrate 100 to create field region 108. Suitable structures for isolation structure 102 include a shallow trench isolation structure or an isolation structure formed by LOCOS techniques. Field region 108 electrically isolates active regions 106a and 106b from one another and possibly from other active regions on the substrate. In subsequent process steps, a p-channel transistor will preferably be formed in active region 106a, and an n-channel transistor will preferably be formed in active area 106b. At least one well (not shown) is preferably formed within the active regions of semiconductor substrate 100. An n-well may be formed in active region 106a, and a p-well may be formed in active region 106b.

Figure 2:
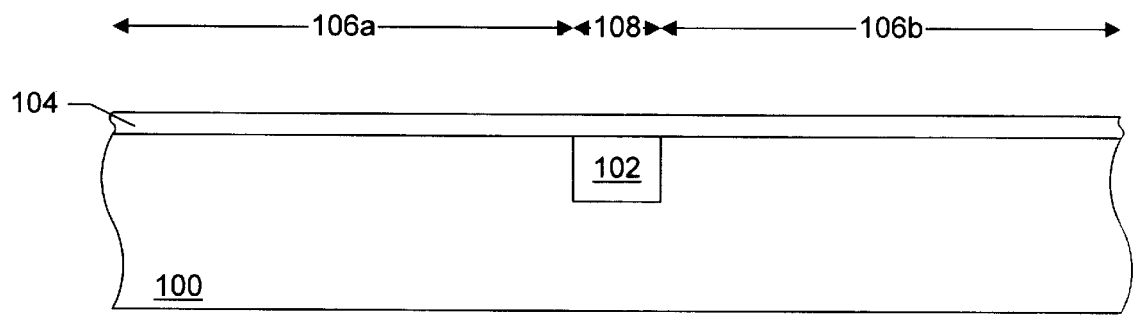
FIG. 2 is a partial cross-sectional view of the semiconductor topography, wherein an oxide layer is formed according to an initial processing step subsequent to FIG. 1.

FIG. 2 depicts the formation of dielectric layer 104 upon semiconductor substrate 100. Dielectric layer 104 is preferably composed of oxide grown upon semiconductor substrate 100. Alternately, dielectric layer may be composed of oxide deposited by, for example, chemical vapor deposition ("CVD") techniques onto semiconductor substrate 100. While oxide is a presently preferred material for dielectric layer 104, this layer may be made of any material capable of being used in a gate dielectric.

Figure 3:
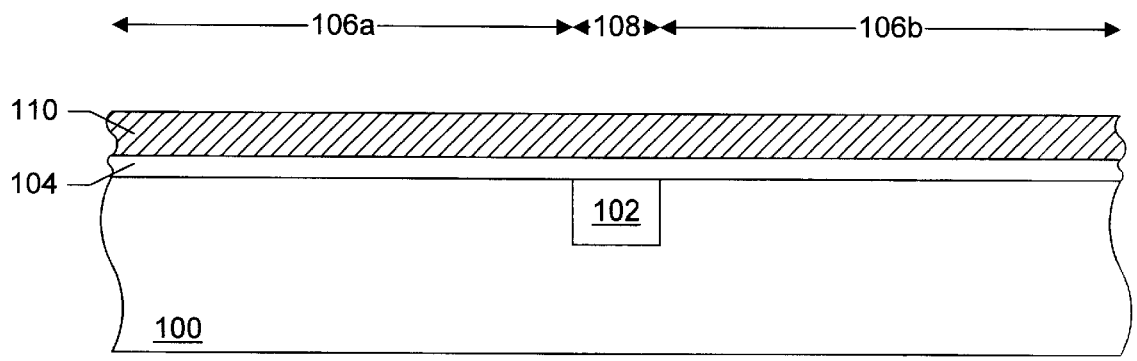
FIG. 3 is a partial cross-sectional view of the semiconductor topography, wherein a first polysilicon layer is formed upon the oxide layer according to a processing step subsequent to FIG. 2.

FIG. 3 shows the formation of first polysilicon layer 110 upon dielectric layer 104. First polysilicon layer 110 is deposited by, for example, low pressure chemical vapor deposition ("LPCVD") techniques. Deposition of first polysilicon layer 110 may be undertaken such that a layer about 1500 angstroms thick is formed. The thickness of first polysilicon layer 110 is preferably uniform over active areas 106.

Figure 4:
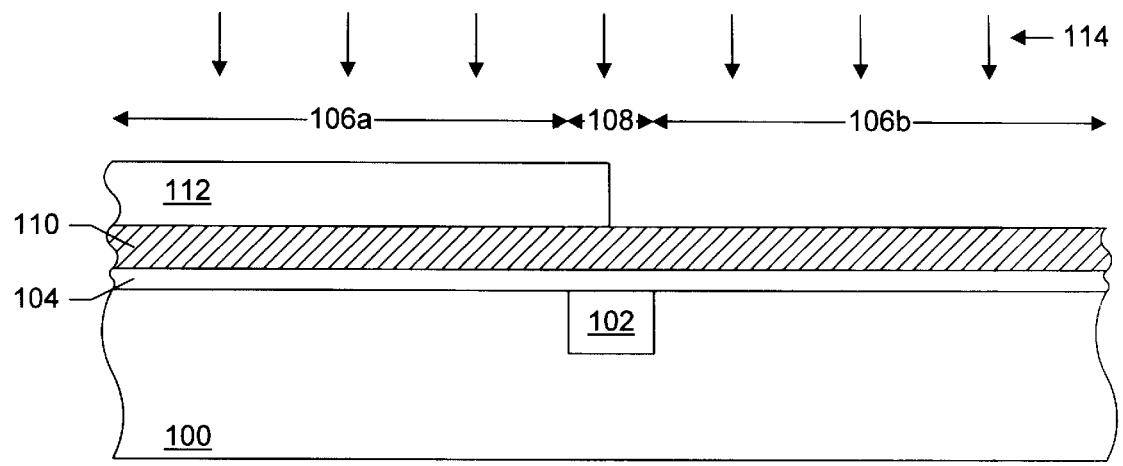
FIG. 4 is a partial cross-sectional view of the semiconductor topography, wherein a first dopant is selectively introduced into a portion of the first polysilicon layer according to a processing step subsequent to FIG. 3.

FIG. 4 illustrates the selective introduction of first dopant 114 into a portion of first polysilicon layer 110 above active region 106b. As part of this selective introduction, masking layer 112, preferably composed of photoresist, may be spun on to first polysilicon layer 110. Masking layer 112 may then be patterned such that the portion of first polysilicon layer 110 above active region 106a is covered by masking layer 112. First dopant 114 may then be implanted into the uncovered portion of first polysilicon layer 110 above active region 106b. First dopant 114 preferably is an n-type dopant with a relatively slow diffusion rate through polysilicon, such as arsenic. The implant depth of first dopant 114 is preferably such that the thermal budget of all remaining processing steps results in the diffusion of a sufficient quantity of first dopant 114 to the interface between first polysilicon layer 110 and dielectric layer 104. First dopant 114 should not be implanted so deeply, however, that the total thermal budget of any subsequent process steps results in the diffusion of a substantial quantity of first dopant 114 into dielectric layer 104, or further into semiconductor substrate 100.

Figure 5:
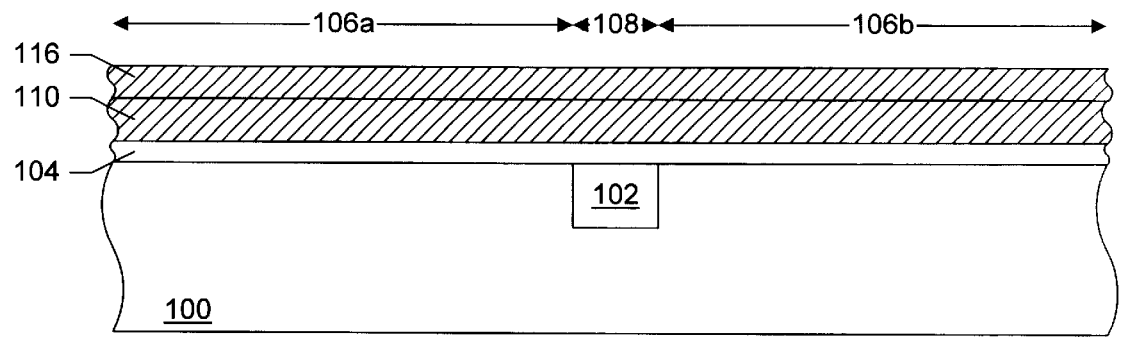
FIG. 5 is a partial cross-sectional view of the semiconductor topography, wherein a second polysilicon layer is formed upon the first polysilicon layer according to a processing step subsequent to FIG. 4.

Turning now to FIG. 5, masking layer 112 may be stripped and second polysilicon layer 116 may then be formed upon first polysilicon layer 110. Second polysilicon layer 116 is preferably deposited by, for example, LPCVD methods. Deposition of second polysilicon layer 116 may be undertaken such that a layer approximately 500–1000 angstroms thick is formed. Because second dopant 119 is preferably implanted through both second polysilicon layer 116 and first polysilicon layer 110, the thickness of second polysilicon layer 116 may be less than the thickness of first polysilicon layer 110. The ratio between the thickness of second polysilicon layer 116 and the thickness of first polysilicon layer 110 is preferably about 1:1.5–3.0. In one embodiment, second polysilicon layer 116 is about 500–1000 angstroms thick. Second polysilicon layer 116 is preferably uniformly thick over active areas 106.

Figure 6:
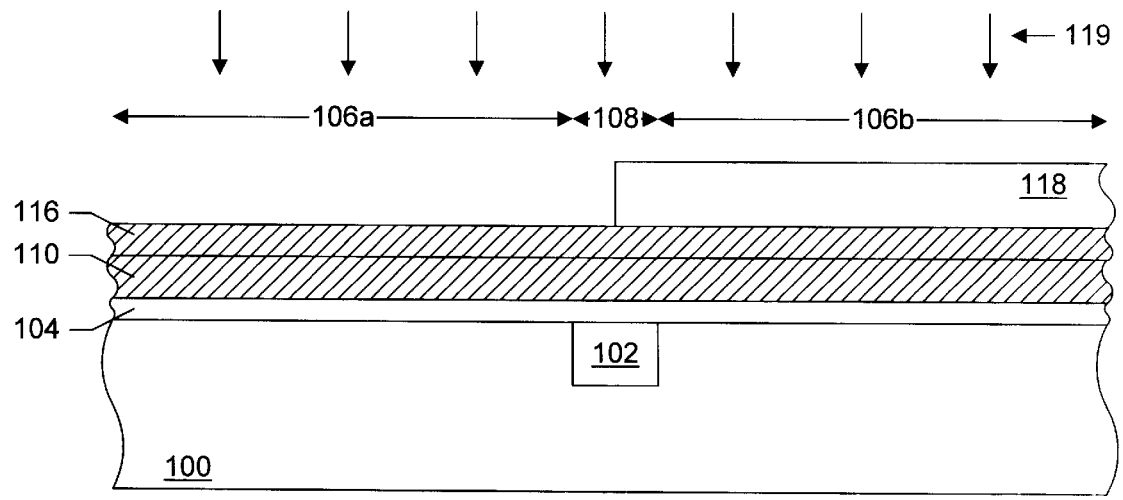
FIG. 6 is a partial cross-sectional view of the semiconductor topography, wherein a second dopant is selectively introduced into a portion of the second polysilicon layer according to a processing step subsequent to FIG. 5.

FIG. 6 depicts the selective introduction of second dopant 119 into a portion of second polysilicon layer 116 above active region 106a. As part of this selective introduction, masking layer 118, preferably composed of photoresist, may be spun on to second polysilicon layer 116. Masking layer 118 may then be patterned such that the portion of second polysilicon layer 116 above active region 106b is covered by masking layer 118. Second dopant 119 may then be implanted into the unprotected portion of second polysilicon layer 116 above active region 106a.

Second dopant 119 is preferably a p-type dopant with a relatively fast diffusion rate through polysilicon, such as boron implanted as boron or boron difluoride ions. Depending on the implant energy with which second dopant 119 is implanted, a considerable quantity of second dopant 119 may be implanted into first polysilicon layer 110 as well. The implant depth of second dopant 119 is preferably such that the total thermal budget of all remaining processing steps results in the diffusion of a sufficient quantity of first dopant 114 to the interface between first polysilicon layer 110 and dielectric layer 104. Second dopant 104 should not be implanted so deeply, however, that the thermal budget of the subsequent process steps results in the diffusion of a substantial quantity of first dopant 114 into dielectric layer 104, or further into semiconductor substrate 100. Because second dopant 119 preferably has a higher diffusion rate through polysilicon than first dopant 114, the combined thickness of second polysilicon layer 116 and first polysilicon layer 110 gives second dopant 119 more polysilicon to diffuse through before reaching dielectric layer 104. Nevertheless, the implant energy with which second dopant 119 is implanted may be substantially less than the implant energy with which first dopant 114 is implanted.

Figure 7:
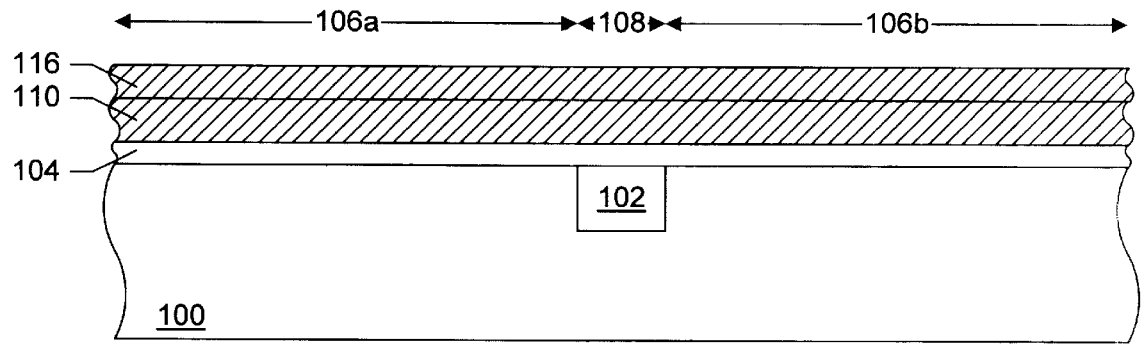
FIG. 7 is a partial cross-sectional view of the semiconductor topography, wherein a masking layer is stripped from above the second polysilicon layer according to a processing step subsequent to FIG. 6.
Figure 8:
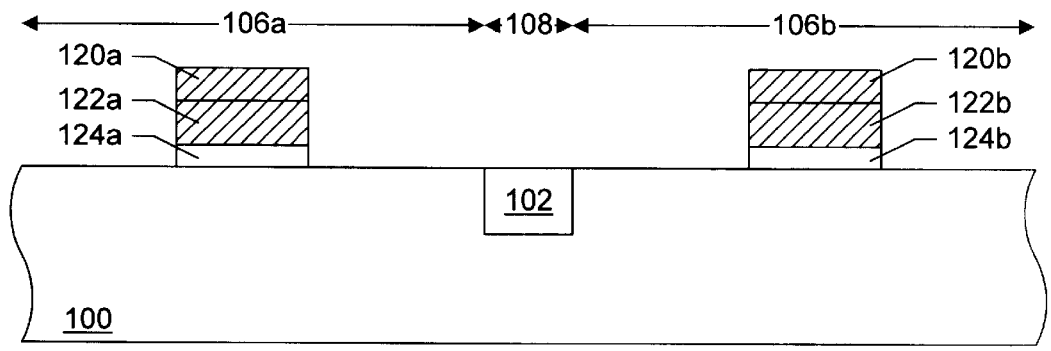
FIG. 8 is a partial cross-sectional view of the semiconductor topography, wherein a first gate structure and a second gate structure are formed according to a processing step subsequent to FIG. 7.

FIG. 7 depicts a processing step in which masking layer 118 is stripped from above second polysilicon layer 118. Referring now to FIG. 8, second polysilicon layer 116, first polysilicon layer 110, and dielectric layer 104 may be patterned to form gate structures within active regions 106. Patterning of the polysilicon layers to form the gate structures is preferably accomplished by an anisotropic dry etch process. The gate structure within active area 106a preferably includes a gate conductor (second polysilicon layer portion 120a and first polysilicon layer portion 122a) and a gate oxide (gate dielectric 124a). Likewise, the gate structure within active area 106b preferably includes a gate conductor (second polysilicon layer portion 120b and first polysilicon layer portion 122b) and a gate oxide (gate dielectric 124b). The thicknesses of each gate conductor are approximately equal; consequently, the heights of each gate structure are about the same. Because second polysilicon layer 116 is preferably masked during the implantation of second dopant 119, second polysilicon layer portion 120b (formed from second polysilicon layer 116) should be substantially free of implanted dopants at this stage of the process. One or more annealing steps to repair implant damage may be done before or after patterning of the polysilicon layers to form the gate conductors, if desired.

Figure 9:
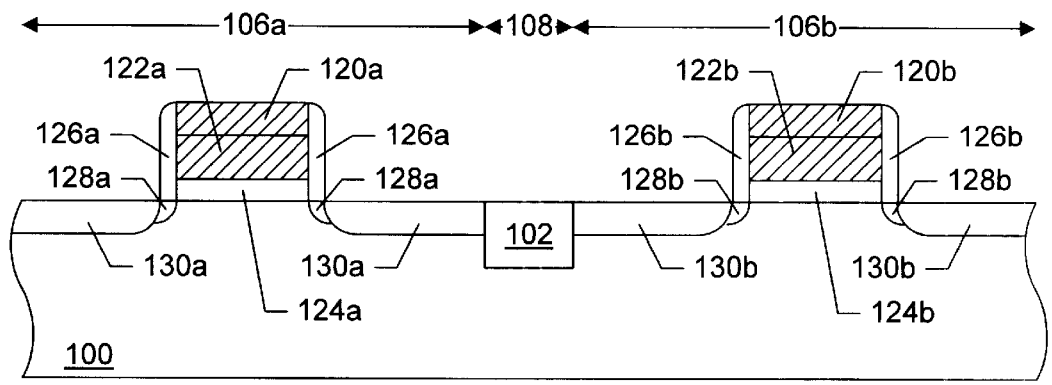
FIG. 9 is a partial cross-sectional view of the semiconductor topography, wherein LDD regions, sidewall spacers, and source/drain regions are formed adjacent to each gate structure according to a processing step subsequent to FIG. 8.

FIG. 9 presents the results of subsequent processing steps in which LDD regions 128 are implanted into semiconductor substrate 100, spacers 126 are formed upon the sidewalls of the gate structures, and source/drain regions are formed by an implant step aligned to the exposed lateral surfaces of spacer 126. LDD regions, spacers, and source/drain regions are preferably formed for the n-channel transistor in active area 106b before the formation of their counterparts to create the p-channel transistor in active area 106a. Because the gate conductors were implanted with dopants in previous steps, the implant energy for these junction formation steps may be determined without consideration of any need to dope the gate conductors. Since shallow junctions are generally desirable in sub-micron MOSFETs, the implant energy used in these junction formation steps is preferably less than that used to implant first polysilicon layer 110 and second polysilicon layer 116. Heat treatment steps are preferably undertaken to anneal implant damage resulting from the junction formation process. If the implant damage done by the implantation of first polysilicon layer 110 and second polysilicon layer 116 has not yet been annealed, then this damage may be repaired at this point as well. The above-described junction formation flow is a presently preferred technique. Any number of alternate methods for forming junctions that would be obvious to one skilled in the art having the benefit of this disclosure may be incorporated.

It will be appreciated by those skilled in the art having the benefit of this disclosure that this invention is believed to provide a method for forming adjacent, oppositely-doped, transistors within an integrated circuit. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for fabricating an integrated circuit, comprising:

providing a first polysilicon layer dielectrically spaced above a first active region and a second active region of a semiconductor substrate;

selectively introducing a first dopant into a portion of the first polysilicon layer above the second active region;

forming a second polysilicon layer upon the first polysilicon layer and above the first active region and the second active region; and selectively introducing a second dopant into a portion of the second polysilicon layer above the first active region.

2. The method of claim 1, wherein said selectively introducing a first dopant comprises:

masking a portion of the first polysilicon layer above the first active region; and implanting the first dopant into the portion of the first polysilicon layer above the second active region, wherein the first dopant is an n-type dopant.

3. The method of claim 1, wherein said selectively introducing a second dopant comprises:

masking a portion of the second polysilicon layer above the second active region; and implanting the second dopant into the portion of the second polysilicon layer above the first active region, wherein the first dopant is a p-type dopant.

4. The method of claim 1, further comprising subsequent to said selectively introducing a second dopant:

patterning the portion of the second polysilicon layer above the first active area and the portion of the first polysilicon layer above the first active area such that a first gate conductor is formed; and patterning the portion of the second polysilicon layer above the second active area and the portion of the first polysilicon layer above the second active area such that a second gate conductor is formed.

5. The method of claim 1, wherein said forming a second polysilicon layer comprises depositing the second polysilicon layer such that a thickness of the second polysilicon layer is less than a thickness of the first polysilicon layer.

6. The method of claim 5, wherein said forming a second polysilicon layer comprises depositing the second polysilicon layer such that a ratio between a thickness of the second polysilicon layer and a thickness of the first polysilicon layer is about 1:1.5–3.0.

7. The method of claim 1, wherein a diffusion rate through polysilicon of the first dopant is less than a diffusion rate through polysilicon of the second dopant.

8. A method for fabricating an integrated circuit, comprising:

providing a semiconductor substrate comprising a first active region and a second active region, the first active region and second active region being laterally separated by a field region;

forming an oxide layer upon the semiconductor substrate;

depositing a first polysilicon layer upon the oxide layer;

while masking a portion of the first polysilicon layer above the first active region, implanting a first quantity of a first dopant into a portion of the first polysilicon layer above the second active region;

depositing a second polysilicon layer upon the oxide layer;

while masking a portion of the second polysilicon layer above the second active region, implanting a first quantity of a second dopant into a portion of the second polysilicon layer above the first active region;

subsequent to said implanting a first quantity of a second dopant, forming a first gate structure from a portion of the second polysilicon layer above the first active area and a portion of the first polysilicon layer above the first active area, wherein the first gate structure comprises a first gate conductor and a first gate oxide; and subsequent to said implanting a first quantity of a first dopant, forming a second gate structure from a portion of the second polysilicon layer above the second active area and a portion of the first polysilicon layer above the second active area, wherein the second gate conductor comprises a second gate conductor and a second gate oxide.

9. The method of claim 8, wherein the first dopant is n-type, and wherein the second dopant is p-type.

10. The method of claim 9, wherein the first dopant is arsenic or phosphorus, and wherein the second dopant is boron or boron difluoride.

11. The method of claim 8, wherein a height of the first gate structure and a height of the second gate structure are approximately equal.

12. The method of claim 8, wherein a peak concentration of the first dopant is a first distance from a bottom of the second gate conductor, and wherein said depositing a first polysilicon layer comprises depositing the first polysilicon layer at a thickness such that the peak concentration of the first dopant, subsequent to and during further processing steps, diffuses sufficiently close to the second gate oxide to avoid dopant depletion in a bottom portion of the second gate conductor without a substantial portion of the first quantity of the first dopant diffusing into the second gate oxide.

13. The method of claim 8, wherein a peak concentration of the second dopant is a first distance from a bottom of the first gate conductor, and wherein said depositing a second polysilicon layer comprises depositing the second polysilicon layer at a thickness such that the peak concentration of the second dopant, subsequent to and during further processing steps, diffuses sufficiently close to the first gate oxide to avoid dopant depletion in a bottom portion of the first gate conductor without a substantial portion of the first quantity of the second dopant diffusing into the first gate oxide.

14. The method of claim 8, further comprising implanting a second quantity of the first dopant into the second active region of the semiconductor substrate and the first gate conductor such that junctions are formed within the second active region of the semiconductor substrate laterally adjacent to the second gate structure, and wherein said implanting a second quantity of the first dopant is at a lesser implant energy than said implanting a first quantity of a first dopant.

15. The method of claim 8, further comprising implanting a second quantity of the second dopant into the first active region of the semiconductor substrate and the first gate conductor such that junctions are formed within the first active region of the semiconductor substrate laterally adjacent to the first gate structure, and wherein said implanting a second quantity of the second dopant is at a lesser implant energy than said implanting a first quantity of a second dopant.

* * * * *